United States Patent [19]

Götz et al.

[11] Patent Number: 4,611,268
[45] Date of Patent: Sep. 9, 1986

[54] METHOD AND ELECTRONIC APPARATUS FOR OPTIMAL ARRANGEMENT OF SHAPES HAVING AT LEAST TWO DIMENSIONS

[76] Inventors: Sándor Götz, Berkenye u.20, H-1025 Budapest; Sándor Krenedits, Ferenc krt. 15., H-1094 Budapest; Ferenc Szatmári, Attila u.108., H-1191 Budapest, all of Hungary

[21] Appl. No.: 568,570

[22] Filed: Jan. 6, 1984

[51] Int. Cl.[4] .................. G06F 15/46; G06F 3/153
[52] U.S. Cl. .................... 364/148; 340/724; 340/739; 364/475
[58] Field of Search ........ 364/474, 475, 148, 191–193; 340/723, 724, 725, 739, 731, 747; 358/183

[56] References Cited

U.S. PATENT DOCUMENTS

| | | | |
|---|---|---|---|
| 3,596,068 | 7/1971 | Doyle | 364/475 X |
| 3,875,389 | 4/1975 | McFadden et al. | 364/472 X |
| 4,178,820 | 12/1979 | Gerber | 364/475 X |
| 4,317,114 | 2/1982 | Walker | 340/747 X |
| 4,327,615 | 5/1982 | Gerber et al. | 364/475 X |
| 4,392,130 | 7/1983 | Lundstrom et al. | 340/747 |
| 4,458,330 | 7/1984 | Imsand et al. | 340/747 X |
| 4,491,836 | 7/1985 | Collmeyer et al. | 340/747 |

Primary Examiner—Joseph Ruggiero
Attorney, Agent, or Firm—Sughrue, Mion, Zinn, Macpeak, and Seas

[57] ABSTRACT

The present invention relates to a method and an electronic apparatus for optimal arrangement of shapes having at least two dimensions, whereby optimization can be performed quickly while satisfying several requirements at the same time.

According to the proposed method shapes to be arranged are stored in the form of vectors, the unfilled areas among the shapes already arranged are defined and the shapes to be arranged are tried to be inserted in these unfilled areas while examining the accidental coincidences in row-line-resolution.

The proposed apparatus includes a vector memory (1), a vector/raster converter (2), a window generator (3), a displacement generator (4), an occupation analyzer (5), a control unit (6), a display unit (7), an external source (8) and intervening organs (9), wherein the vector memory (1) is connected to the control unit (6), the displacement generator (4) and the vector/raster converter (2), the external source (8) is connected to the displacement generator (4) and the control unit (6), the control unit (6) is connected to the displacement generator (4), the window generator (3), the occupation analyzer (5) and the intervening organs (9), the occupation analyzer (5) is connected to the vector/raster converter (2), the vector/raster converter (2) is connected to the display unit (7), the window generator (3) is connected to the displacement generator (4) and the vector memory (1) or the vector/raster converter (2).

12 Claims, 5 Drawing Figures

METHOD AND ELECTRONIC APPARATUS FOR OPTIMAL ARRANGEMENT OF SHAPES HAVING AT LEAST TWO DIMENSIONS

The present invention relates to a method of and an electronic apparatus for optimal arrangement of having at least two dimensions. Optimal arrangement of various shapes according to certain aspects is a task that often occurs in technical life. Most commonly this problem occurs in case of arrangement of plane shapes, i.e. to achieve the most economical use of a given basic material.

The task of defining the optimal arrangement of two-dimensional shapes on a given area to minimize the loss of material is among the simplest ones of this kind. In most cases it is not enough merely to define the maximal number of shapes that can be arranged, but other factors must also be taken into account, such as technologically preferred directions, patterns, etc.

In state of the art technical practice such tasks occur in a more complicated form than before, due on the one hand to the increased number of conditions to be observed and to the fact that such tasks often occur in the case of threedimensional shapes, on the other. Similar tasks of arrangement often occur in iron, cloth or leather cutting and in the case of defining the optimal area utilization of means of transport. Similar tasks have to be fulfilled when arranging extremely crowded spaces (e.g. car engine space, power plant engine room, ship engine room, etc.).

For such tasks at present the computers employing a graphic design system offer a solution.

In such systems tasks of this kind are generally solved by the interactive method, however, there is an automatic method already known which is applicable under certain conditions.

The methods applied presently require much computer time and are characterized by the fact that optimization is generally carried out for one purpose (e.g. to achieve a maximum material utilization) while the technological requirements are not taken into account.

The aim of the present invention is to develop a method and apparatus whereby the shapes can be optimally arranged in a given area according to several aspects. By the fulfilment of the above aim a rather important problem is solved and similar tasks of various industrial sectors can be solved much more easily.

The tasks of the present invention is to produce a method and an apparatus for the fulfilment of the above aim, whereby the tasks of optimization can quickly be performed satisfying several requirements at the same time.

According to the present invention the above task is solved by a method whereby the data of shapes to be arranged are stored in the form of vectors, unfilled areas between the shapes that have already been arranged are defined and the shapes to be arranged are compared with the unfilled areas for purposes of insertion, therein while examining the new arrangements and the accidental coincidences in a matrix format and determining the optimal arrangement.

In a preferred embodiment of the method according to the invention the accidental coincidences of a shape to be newly inserted among the ones already arranged and stored in the form of vectors are examined in relation with those shapes only that are situated in the environment of the unfilled area chosen for the new shape to be inserted.

The electronic apparatus for arranging shapes having at least two dimensions that is suitable for realization of the method proposed above comprises according to the present invention a vector memory, a vector/raster converter, a window generator, a displacement generator, an occupation analyser, a control unit, a display unit, an external source and an interface unit, wherein the vector memory is connected to the control unit, the displacement generator and the vector/raster converter, the external source is connected to the displacement generator and to the control unit, the control unit is connected to the displacement generator, the window generator, the occupation analyser and the interface unit, the occupation analyser is connected to the vector/raster converter, the vector/raster converter is connected to the display unit, the window generator is connected to the displacement generator and the vector memory or the vector/raster converter.

In a preferred embodiment of the electronic apparatus according to the present invention the vector memory comprises a memory, a double normal form transformer, a provisional memory, a comparator unit and a stack memory, whereby the double normal form transformer is connected to the provisional memory, the provisional memory is connected to the comparator and the memory, the comparator unit is connected to the memory and the stack memory, the stack memory is connected to the memory.

In a further preferred embodiment of the electronic apparatus according to the present invention, the displacement generator is constructed with an inner controller, a shape memory, a multiplexer, a position transformer, overlap analyzing means, a scalar value generator, an environment memory, a scalar value stack memory and a stack memory controller, whereby the inner controller is connected to the shape memory, the stack memory controller and the multiplexer, the multiplexer is connected to the stack memory controller and the position transformer, the position transformer is connected to the overlap analyzing means, the scalar value generator and the environment memory, the scalar value generator is connected to the environment memory, the scalar value generator is connected to the scalar value stack memory, the scalar value stack memory is connected to the stack memory controller and the shape memory is connected to the position transformer.

In another preferred embodiment of the electronic apparatus according to the present invention the occupation analyser includes a separator unit, a discriminator unit, an unfilled area totalizer, a co-ordinate counter, a co-ordinate register, an unfilled dots counter, a gravity centre generator, an area generator, a write-in logic, a parameter memory, a minimum limiter equivalence unit, a minimum limiter register, a magnitude logic, a length register, a length equivalence unit, an interval register, an interval equivalence unit, an address register, a magnitude register, a magnitude equivalent unit and a magnitude latch memory, while the separator unit is connected to the unfilled area totalizer, the co-ordinate counter and the discriminator unit, the discriminator unit is connected to the unfilled area totalizer, the co-ordinate register, the unfilled dot counter, the magnitude logic, the length equivalence unit, the write-in logic and the interval equivalence unit, the co-ordinate register is connected to the write-in logic and the interval equivalence unit, the unfilled dot counter is connected to the gravity centre generator, the area generator, the write-in logic, the length equivalence unit and the minimum limiter equivalence unit, the minimum limiter equivalence unit is connected to the magnitude logic and the minimum limiter register, the magnitude logic is connected to the write-in logic, the length equivalence unit is connected to the write-in logic and the length register, the length register is connected to the parameter memory, the address register is connected to the parameter memory and the interval equivalence unit, the interval equivalence unit is connected to the write-in logic and the interval register, the interval register is connected to the parameter memory and the magnitude equivalence unit, the magnitude equivalence unit is connected to the parameter memory, the magnitude latch memory and the magnitude register, the magnitude latch memory is connected to the parameter memory, the co-ordinate counter is connected to the co-ordinate register, the gravity centre generator and the area generator are connected to the write-in logic, and the write-in logic is connected to the parameter memory.

A more detailed specification of the method and apparatus according to the present invention will be given below with reference to the embodiments shown purely by way of example in the accompanying drawings, wherein.

Figure 1:
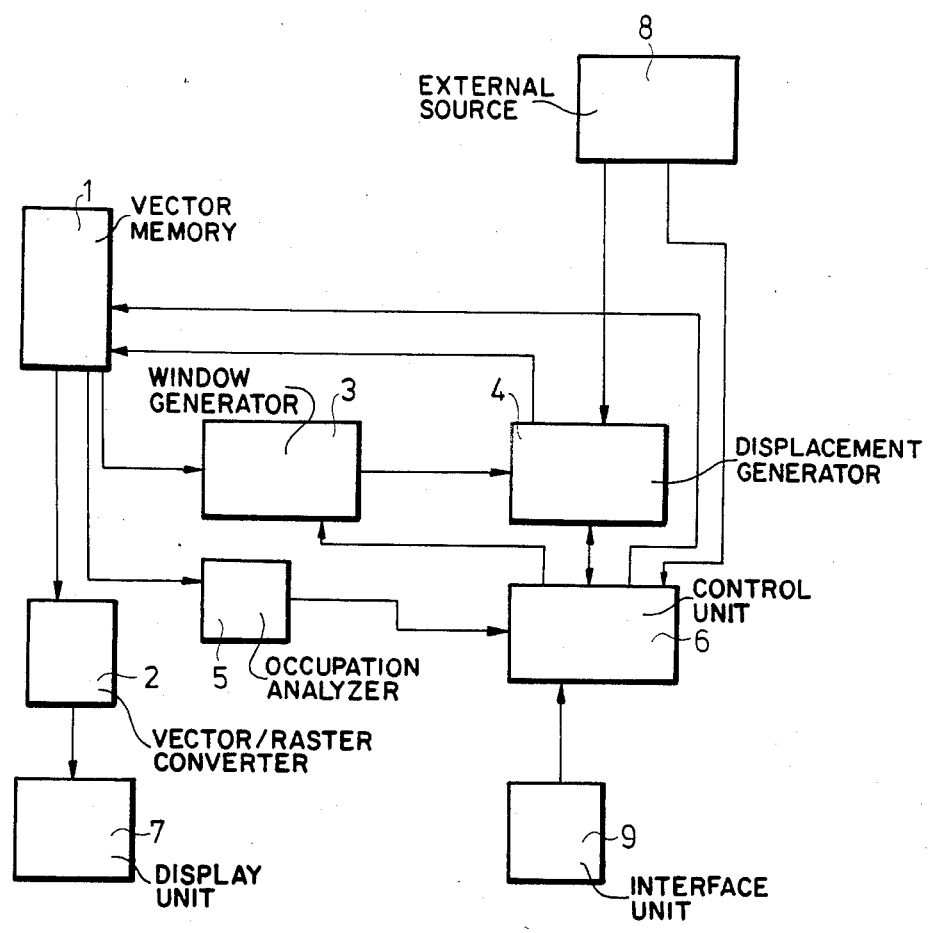
FIG. 1 is a block diagram of an advantageous embodiment of the apparatus according to the present invention.
Figure 2:
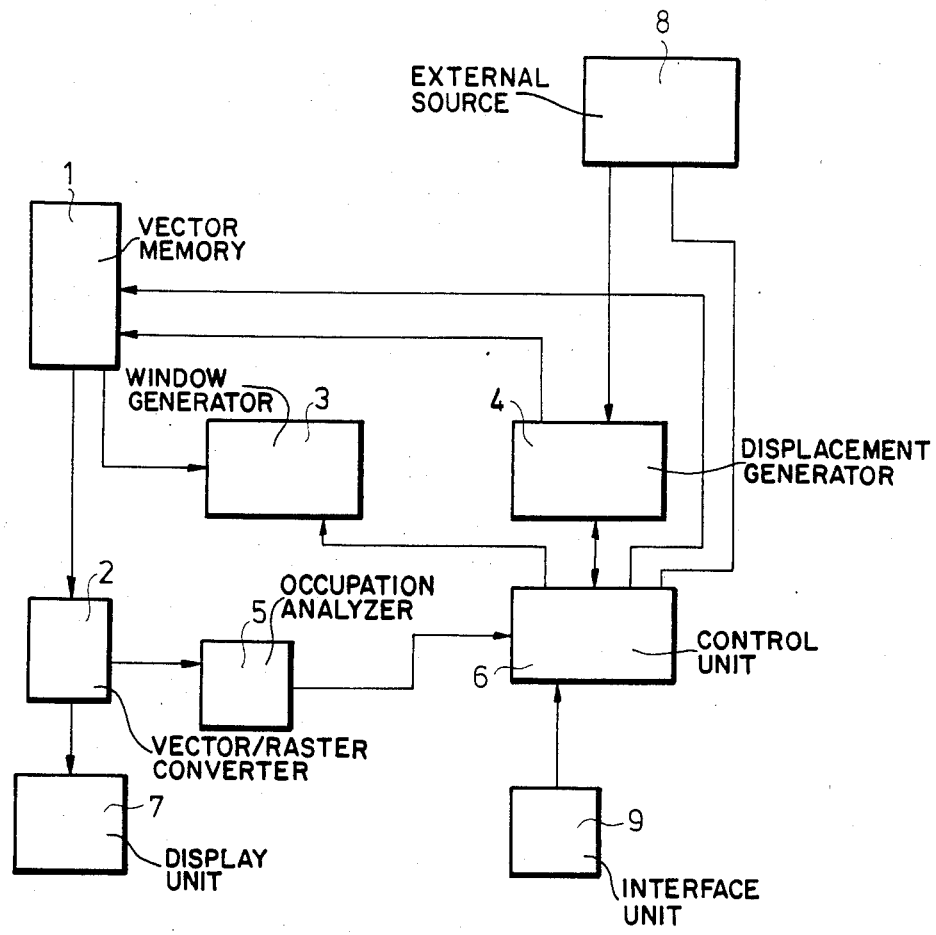
FIG. 2 is the block diagram of another advantageous embodiment of the apparatus according to the present invention.

The apparatus according to the present invention comprises, as shown in FIGS. 1 and 2, a vector memory 1, a vector/raster converter 2, a window generator 3, a displacement generator 4, an occupation analyser 5, a control unit 6, a display unit 7, an external source 8 and an interface unit 9.

The vector memory 1 is connected to the control unit 6, the displacement generator 4 and the vector/raster converter 2. The external source 8 is connected to the displacement generator 4 and the control unit 6. The control unit 6 is connected to the displacement generator 4, the window generator 3, the occupation analyser 5 and the interface unit 9. The occupation analyser 5 is connected to the vector/raster converter 2, and the vector/raster converter 2 is connected to the display unit 7. The window generator 3 is connected to the displacement generator 4 and to the vector memory 1 (FIG. 1) or to the vector/raster converter 2 (FIG. 2).

The way of operating of the apparatus shown by way of example by embodiments of FIGS. 1 and 2 is disclosed herebelow. Two operational modes can be distinguished: the interactive and the automatic operational modes.

In the interactive operational mode the shapes already stored in the vector memory 1 are displayed by the display unit 7 through the vector/raster converter 2.

Under direction of the interface unit 9 the control unit 6 virtually turns off or shifts the shapes in the vector memory 1. In such a manner the virtually repositioned shape is displayed by the display unit 7 thus displaying the result of the intervention on the display unit 7.

Compared to the automatic operational mode this so-called interactive operational mode is, however, of less importance. In the automatic operational mode the information is received from the occupation analyser 5 by the control unit 6 on the unfilled areas among the shapes already arranged. The control unit 6 examines which shapes are to be arranged, data of which can be called from the external source 8, then on the basis of this information it defines the parameters of the window generator 3, namely the area which—as if cut out of the total area—must be applied for the arrangement of the shapes to be inserted. As a next step the vectorial specification of shapes to be arranged from the external source 8 and the data of the area chosen by the window generator 3 get to the displacement generator 4 in which, governed by the control unit 6—while taking into account all other conditions of arrangement—an actual virtual arrangement is set up by examining the extreme values of repeated trial arrangements. After approval of the arrangement the newly inserted shape—upon the command of the control unit 6—is written into an appropriate position in the vector memory 1.

Thereafter, another trial arrangement is set up with another shape from the external source 8 and the procedure is cyclically repeated. The procedure terminates when—upon the information of the occupation analyser 5—there is insufficient unfilled area remaining for the control unit 6 to call down shapes from the external source 8 and position them appropriately.

Figure 3:
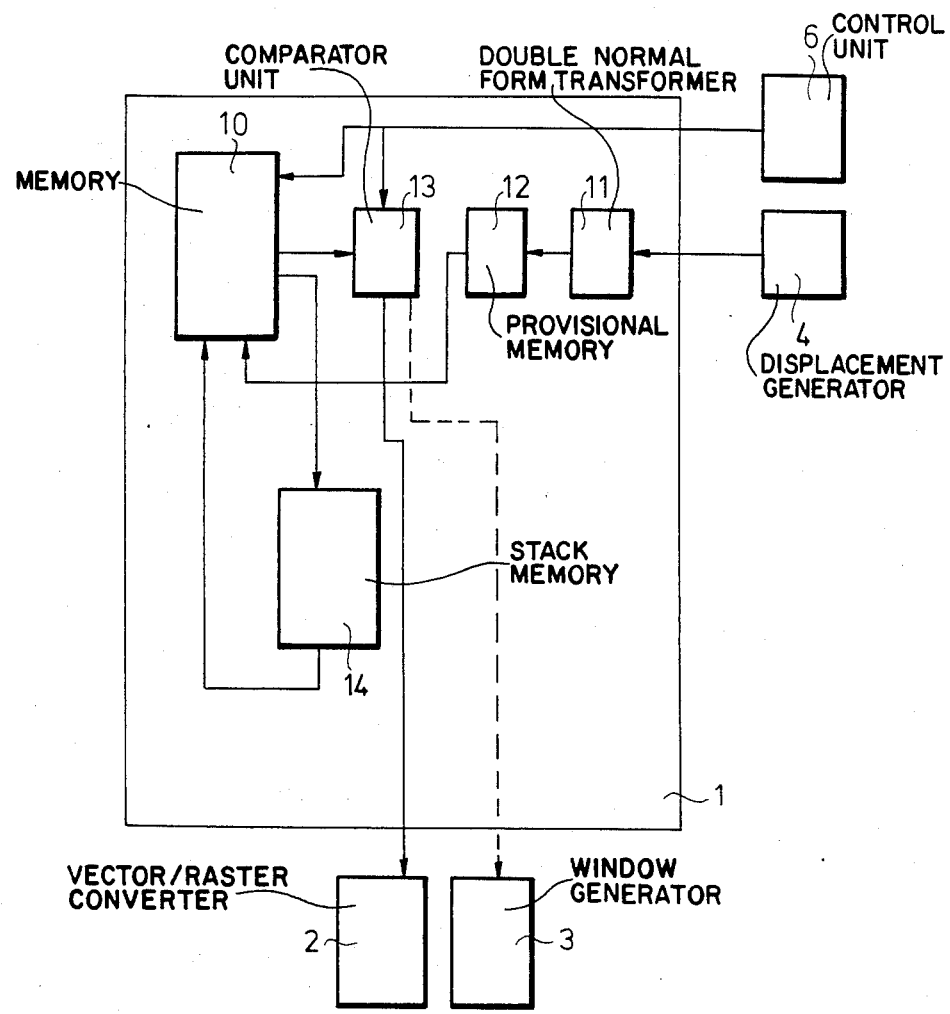
FIG. 3 is the block diagram of a preferred embodiment of the vector memory applied in the apparatus according to the present invention.

FIG. 3 is the block diagram of one actual embodiment of the vector memory 1 applied in the apparatus according to the present invention.

According to FIG. 3 the vector memory 1 can be composed of a memory 10, a double normal form transformer 11, a provisional memory 12, a comparator unit 13 and a stack memory 14. The double normal form transformer 11 is connected to the provisional memory 12 and the provisional memory 12 is connected to the comparator unit 13 and the memory 10. The comparator unit 13 is connected to the memory 10 and the stack memory 14, and the memory 10 and the stack memory 14 are connected to each other.

As to the remaining units of the equipment, the control unit 6 is connected to the comparator unit 13 and the memory 10, the displacement generator 4 is connected to the double normal form transformer 11, the vector/raster converter 2 is connected to the comparator unit 13, and—in a given case, the window generator 3 is connected to the comparator unit 13.

The way of operating of the vector memory 1 shown by way of example in FIG. 3 is specified herebelow.

If there is no need any more to fill new shapes into the vector memory 1 and so into the memory 10, the control unit 6 will control the comparator unit 13 so as to transfer the contents of the memory 10 through the comparator unit 13 directly into the vector/raster converter 2.

If a new shape suitably positioned by the displacement generator 4 is to be inserted in the video information, this new shape will get through the double normal form transformer 11 into the provisional memory 12. The double normal form transformer 11 is responsible for vectorial resolution of a kind where the conversion to a definition by rows and columns is complete. In such a case read-out of memory 10 continues normally until the comparator unit 13 recognizes that the shape stored in the provisional memory 12 has priority of display since this very shape has been inserted by the displacement generator 4 in the area being displayed. In such a case the comparator unit 13—upon the permissive signal of the control unit 6—lets through the vector representation of the new shape to the vector/raster converter 2, while feeding the shape of the previous video information next in order into the stock memory 14 inserting—at the same time—the new shape from the provisional memory 12 into its place in the new video information into the memory 10.

After that the previous shape being stored in the stack memory 14 will be displayed and written into the memory 10 by continuous change of shapes in a way that it is always the shape written over that will be stored by the stack memory 14. In this way the procedure of insertion will go on through a whole picture cycle.

If a shape is to be cancelled in the memory 10 and must be replaced by another one, the procedure is as follows: The shape to be cancelled in the memory 10 will not get through the comparator unit 13 as it is prohibited by the control unit 6 and the next shape not to be cancelled will—through the stack memory 14—be written in the place thus become empty in the memory 10.

Figure 4:
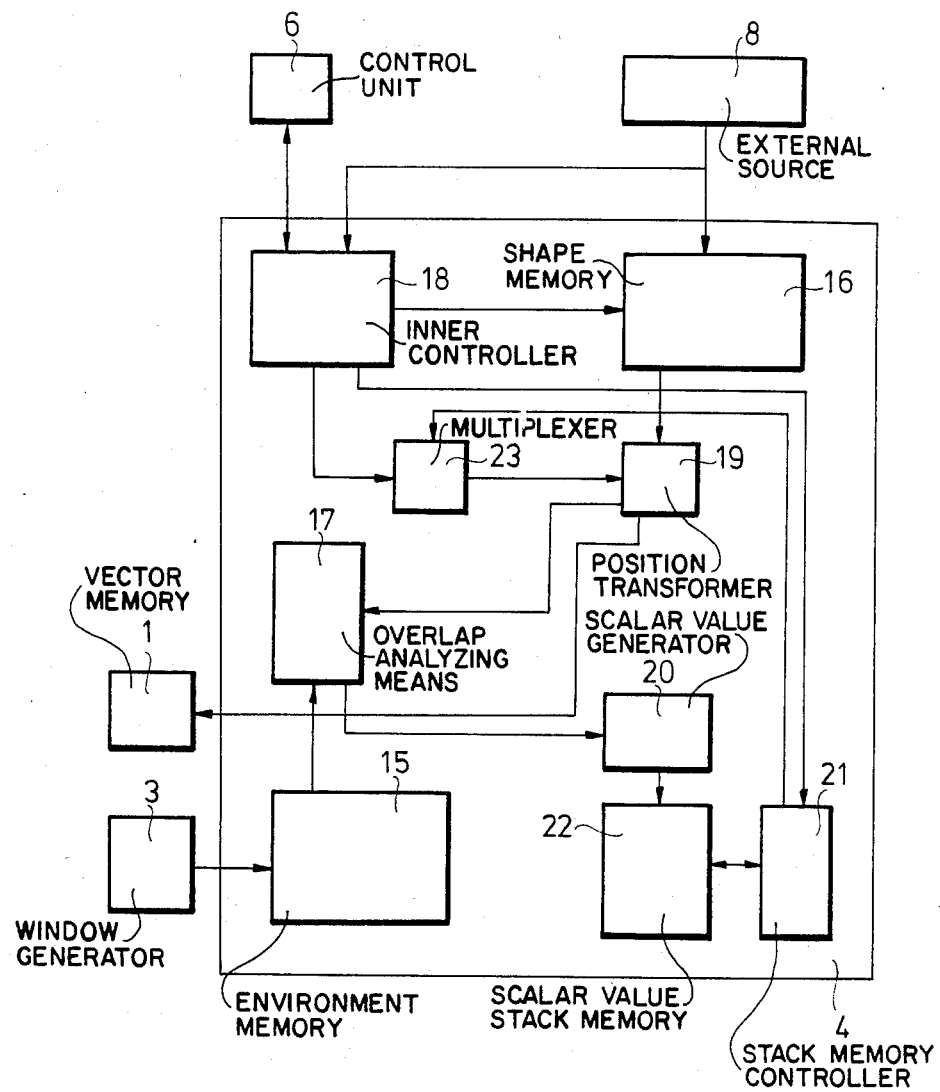
FIG. 4 is the block diagram of a preferred embodiment of the displacement generator applied in the apparatus according to the present invention.

FIG. 4 shows a preferred arrangement of the displacement generator 4 applied in the apparatus according to the present invention. This embodiment of the displacement generator 4 includes an environment memory 15, a shape memory 16, overlap analyzing means 17, an inner controller 18, a position transformer 19, a scalar value generator 20, a stack memory controller 21, a scalar value stack memory 22 and a multiplexer 23. The environment memory 15 is connected to the overlap analyzing means 17, which is connected in turn to the scalar value generator 20 and the position transformer 19, the position transformer 19 is connected to the multiplexer 23, the shape memory 16 and the scalar value stack memory 22, the scalar value stack memory 22 is connected to the scalar value generator 20 and the stack memory controller 21. The stack memory controller 21 is connected to the multiplexer 23 and the inner controller 18, and the inner controller 18 is connected to the multiplexer 23 and the shape memory 16. Among other units of the equipment the control unit 6 is connected to the inner controller 18 and the shape memory 16, the vector memory 1 is connected to the position transformer 19 and the window generator 3 is connected to the environment memory 15. This embodiment of the arrangement generator 4 will be disclosed below. The vector representation of shapes to be arranged gets from the external source 8 into the shape memory 16. The parameters which define the number of trial arrangements to be performed and the technological requirements influencing the arrangement (cutting direction, tecture, patterns, anisotropy, etc.) also passes from the external source 8 into the inner controller 18. At the same time the vector representation of shapes already stored in the vector memory 1 so far are fed by the window generator 3 under control of the occupation analyser 5—into the environment memory 15. The vector representation of the shape to be inserted gets from the shape memory 16—transformed (by rotation or translation) by the position transformer 19—into the overlap analyzing means 17. Contents of the environment memory 15 will get here, as well. The inner controller 18—through the multiplexer 23 and the position transformer 19—generates ever new arrangements as long as the overlap analyzing means 17 senses a non-overlapping arrangement of shapes already arranged and of shapes intended to be arranged or until the number of trials stored in the inner controller 18 is exhausted.

If a non-overlapping buffer has occurred in the overlap analyzing means 17, the inner controller 18 allows the stock memory controller 21 to write in the actual parameters of the position transformer 19 and the actual value of the scalar value generator 20 into the scalar value stack memory 22. The scalar value generator 20 serves to produce—according to an algorithm not detailed here—a scaler figure for the quality of insertion of shapes already arranged and to be arranged.

The stack memory controller 21 keeps in evidence the highest scalar value achieved. This procedure will repeat itself with various environment subsets then—upon achievement of the frequency given for the trials—the stack memory controller 21—commanded by the inner controller 18 selects one of the scalar values stored in the scalar value stack memory 22 by an extreme value test, then it transfers the relative shifting and rotation parameters through the multiplexer 23 into the position transformer 19. The vector representation of the shape kept in the shape memory 16 and to be inserted then gets through the position transformer 19 where it is duly transformed into the vector memory 1. Practically, the displacement generator 4 selects the parameters of the best position of the shape to be inserted marking the best position with a scaler figure and it inserts the shape to be inserted in this virtual position in the vector memory 1.

Figure 5:
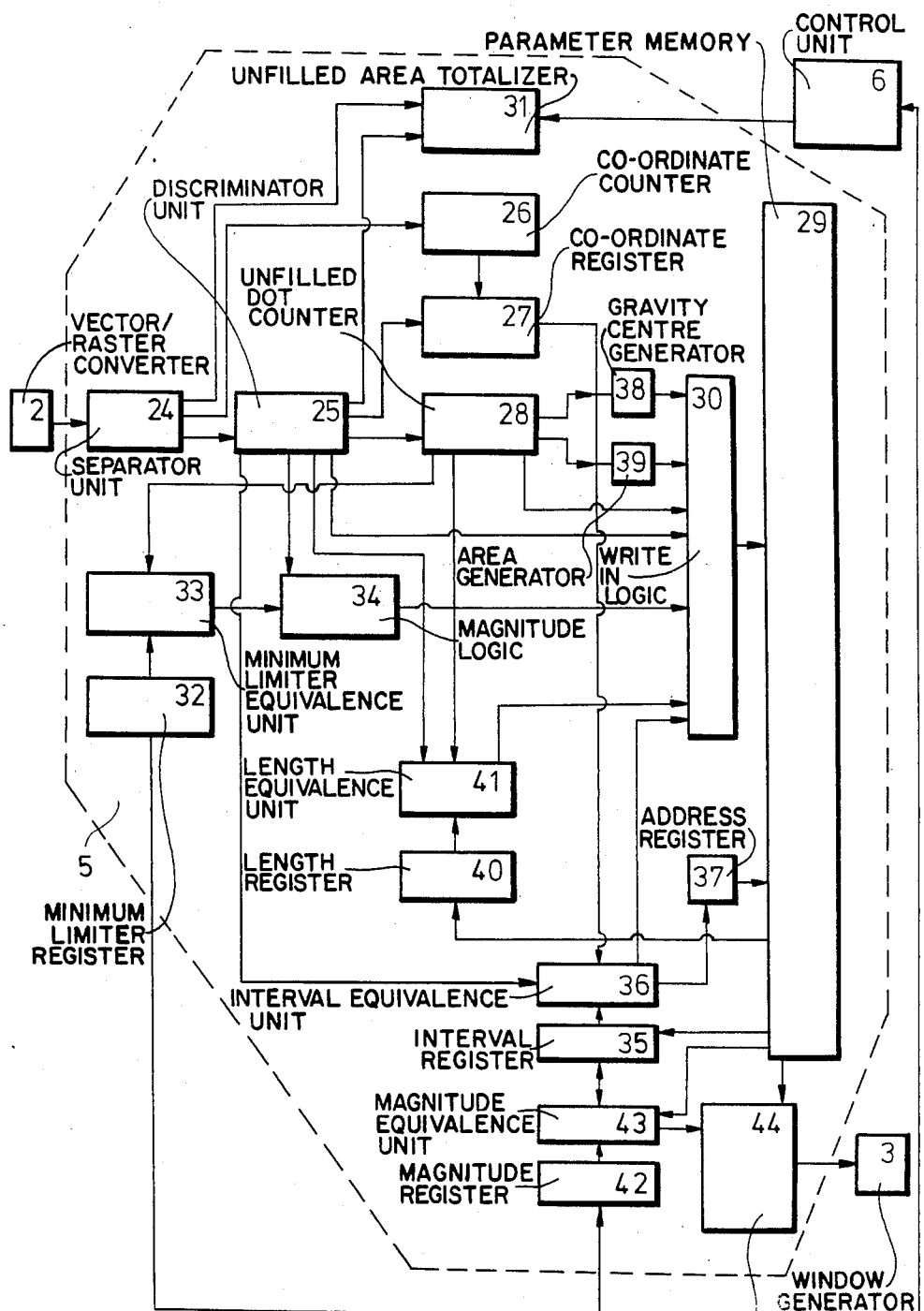
FIG. 5 is the block diagram of a preferred embodiment of the occupation analyser applied in the apparatus of the present invention.

The block diagram of a preferred embodiment of the occupation analyser applied in the apparatus according to the present invention is shown in FIG. 5.

The task of the occupation analyser 5 is to discover the unfilled areas in the arrangement area where a new shape can potentially be inserted. The actual arrangement is then performed by the displacement generator 4 in the area defined by the window generator 3.

This embodiment of the occupation analyser 5 consists of a separator unit 24, a discriminator unit 25, a co-ordinate counter 26, a co-ordinate register 27, an unfilled dot counter 28, a parameter memory 29, a write-in logic 30, an unfilled area totalizer 31, a minimum limiter register 32, a minimum limiter equivalence unit 33, a magnitude logic 34, an interval register 35, an interval equivalence unit 36, an address register 37, a gravity centre generator 38, an area generator 39, a length register 40, a length equivalence unit 41, a magnitude register 42, a magnitude equivalence unit 43 and a magnitude stack memory 44.

The separator unit 24 is connected to the unfilled area totalizer 31, the co-ordinate counter 26 and the discriminator unit 25, and the discriminator unit 25 is connected to the unfilled area totalizer 31, the co-ordinate register 27, the unfilled dot counter 28, the interval equivalence unit 36, the write-in logic 30, the length equivalence unit 41 and the magnitude logic 34. The co-ordinate counter 26 is connected to the co-ordinate register 27; the co-ordinate register 27 is connected to the interval equivalence unit 36 and the write-in logic 30; and the unfilled dot counter 28 is connected to the gravity centre generator 38, the area generator 39, the write-in logic 30, the length equivalence unit 41 and the minimum limiter equivalence unit 33. The minimum limiter equivalence unit 33 is connected to the magnitude logic 34 and the minimum limiter register 32, and the magnitude logic 34 is connected to the write-in logic 30.

The length equivalance unit 41 is connected to the write-in logic 30 and the length register 40, the length register 40 is connected together with the write-in logic 30 and the address register 37 to the parameter memory 29. The interval equivalence unit 36 is connected to the address register 37 to the parameter memory 29. The interval equivalence unit 36 is connected to the address register 37 and the interval register 35. The interval register 35 is connected to the parameter memory 29 and the magnitude equivalence unit 43: the magnitude equivalence unit 43 is connected to the parameter memory 29, the magnitude stack memory 44 and the magnitude register 42; and the magnitude stack memory 44 is connected to the parameter memory 29.

Among the other units of the equipment the vector-/raster converter 2 is connected to the separator unit 24, the control unit 6 is connected to the unfilled area totalizer 31, the magnitude register 42 and the minimum limiter register 32.

The operation of the occupation analyser shown in FIG. 5 now will be described.

During operation, the unit defines line by line (with respect to a matrix defined by intersections of rows and columns) the length of intervals not occupied by shapes yet and their relative co-ordinates. The occupation analyser 5 will compose a continuous area from the unfilled intervals and it will produce the gravity centre and territory data of this area. When defining the territory of the area, the occupation analyser 5 examines whether the total of unfilled intervals found in the neighbouring lines are long enough, that is, if they are sufficiently overlapping and if the magnitude of the area composed in this way reaches the value of the shapes to be arranged.

In case the above conditions are not fulfilled, the occupation analyser 5 will sense a discrete unfilled area, that is, in case the required magnitude is not reached, the examined area will not be indicated by the occupation analyser 5 to the window generator 3 as an unfilled area.

During operation of the occupation analyser 5, the shapes arranged so far will get out of the vector/raster converter 2 as video dots—together with the horizontal and vertical synchronizing pulses and the colour signals necessary for representation—through the separator unit 24 and get into the discriminator unit 25. The separator unit will clear the unfilled area totalizer 31 by each picture repetition and the co-ordinate counter 26 line by line. The discriminator unit 25 will recognize from the signal information of each video dot (e.g. 1-0) that the dot being represented at the moment contains a shape or an unfilled area. If it is an unfilled area, signals from the discriminator unit 25 will increment the unfilled area totalizer 31 and the unfilled dots counter 28.

Signals of the separator unit 24 increment the co-ordinate counter 26. When the discriminator unit 25 recognizes the end of a shape in the line concerned, it stores the contents of the co-ordinate counter 26 in the co-ordinate register 27, i.e. it defines the starting points of the unfilled interval in the line. The control unit 6 charges the minimum limiter register 32 up to a value which defines the minimum length of an unfilled interval which is enough for the arrangement of the shapes to be inserted. So the magnitude logic 34 permits consideration of the unfilled interval of the line concerned as an unfilled area only in case the length of the unfilled interval found in the line concerned exceeds the content of the minimum limiter register 32.

Logically, after each unfilled area/shape transition, the discriminator unit 25 clears the magnitude logic 34. The starting and ending coordinates of the unfilled interval and the value generated so far by the gravity centre and the territory are read out line by line from the parameter memory 29. The starting and ending co-ordinates of the above pass to the interval register 35, while the other data pass to the magnitude equivalence unit 43.

The control unit 6 will also charge the magnitude register 42, so—based on the control of the magnitude equivalence unit 43—the data of all unfilled areas that reach the magnitude stored in the magnitude register 42 thus seem to be suitable for arranging the shapes to be arranged get into the magnitude stack memory 44. In order to explore the continuous unfilled areas, the relative position of the unfilled interval of each line and that of the unfilled interval preceding the current line must be compared.

This comparison is performed by the interval equivalence unit 36 by comparing the data of the interval register 35 containing the data of the preceding line and those of the co-ordinate register 27 containing the data of the current line. If there is a certain degree of overlapping of unfilled intervals found in the two lines, these unfilled intervals are considered as continuous, comprising a continuous unfilled area. But if the required degree of overlapping is not fulfilled, the interval equivalence unit 36 increases the contents of the address register 37 and appoints a new address in the parameter memory 29 for storing the initial data of a new unfilled area. When appointing the unfilled area, the length equivalence unit 41 is also participating in a way that it compares the length of the unfilled interval in the current line with that of the unfilled interval in the preceding line. Both the gravity centre generator 38 and the area generator 39 are controlled by the unfilled dot counter 28, as a matter of fact, if—as a result of the examination—the unfilled intervals found in the current line seem to be the continuation of those found in the preceding line, i.e. they constitute a continuous unfilled area, the gravity centre and the territory values of which calculated beforehand must be renewed. If, however, the unfilled interval in the current line is the beginning of a new unfilled area, the preceding unfilled area is finished and a new unfilled area is started to be generated.

The contents of the unfilled area totalizer 31 are written into the control unit 6 by each picture repetition, consequently the control unit 6 is continuously informed of the rate of occupation of the area intended for shapes to be inserted therein.

The advantage of the method and equipment of the present invention is that modelling of the arrangement of two and three-dimensional shapes can quickly be performed while observing several conditions.

The field of protection defined by the following claims is not of course restricted to the preferred embodiments described and illustrated purely by way of example. The invention is applicable to any systems wherein planar or threedimensional shapes are to be arranged in a predetermined plane or space: It should be understood that apparata and units equivalent to those given above will depend on the field of application and the given circumstances, however, they will be within the scope of the claimed invention.

We claim:

1. A method of optimal arrangement of multidimensional shapes within a predetermined space, comprising the following steps:
   (i) storing data, in vectorial form, of shapes already arranged;
   (ii) providing data, in vectorial form, of shapes to be arranged;
   (iii) generating one of a predetermined number of positions of one of said shapes to be arranged within said predetermined space with respect to said shapes already arranged;
   (iv) repeating said step (iii) in accordance with a comparison of row-column resolutions of said shapes already arranged with said one of said shapes to be arranged, a scalar value being assigned to each outcome of said step (iii) in accordance with a predetermined algorithm;
   (v) storing, in vectorial form, a position of said one of said shapes to be arranged, in accordance with scalar values generated in said steps (iii)-(iv), whereby said one of shapes to be arranged becomes one of said shapes already arranged; and
   (vi) repeating said steps (i)-(v) until an insufficient amount of said space remains to arrange any more shapes.

2. A method as claimed in claim 1, wherein determination of whether said insufficient amount remains comprises the following steps:
   receiving data representative of said shapes already arranged;
   evaluating, in matrix form, vectorial data representative of said space;
   determining, in matrix form, said positioning of said data representative of said shapes already arranged within said space, whereby unfilled space may be identified in matrix form;
   examining consecutive rows and columns within said unfilled space;
   comparing vectorial lengths of said rows and columns with vectorial lengths of shapes to be arranged; and
   outputting signals representative of said insufficient remaining, if said vectorial lengths of said rows and columns are shorter than said vectorial lengths of shapes to be arranged.

3. A method as claimed in claim 1, wherein said steps (iii)-(v) are performed with respect only to said shapes already arranged which are an in immediate vicinity of a portion of said space where said one of said shapes to be arranged is intended to be placed.

4. A method as claimed in claim 1, wherein said steps (i)-(vi) are performed automatically, without external manual assistance.

5. An apparatus for optimal arrangement of multidimensional shapes within a predetermined space, said apparatus comprising:
   vector memory means for storing, in vectorial form, data representing shapes already arranged within said predetermined space;
   window generator means for generating vectorial representations of boundaries between shapes already arranged and unfilled portions of said predetermined space; and
   displacement generator means for determining placement of shapes to be arranged in accordance with scalar values generated pursuant to comparisons of vectorial representations of said unfilled portions with vectorial representations of different orientations and positions of said shapes to be arranged, said displacement generator means performing said comparisons and selecting an appropriate one of said positions and orientations, whereby said optimal arrangement is achieved.

6. An electronic apparatus as claimed in claim 5, further comprising:
   vector/raster converter means for converting vectorial representations in said vector memory means to a form suitable for a CRT display;
   occupation analyzer means for identifying said unfilled portions wherein said shapes to be arranged may be inserted;
   control means for examining said vectorial representations of said different orientations and positions of said shapes to be arranged;
   display means for receiving an output of said vector/raster converter means; and
   external source means for externally providing, in vectorial form, data representative of said shapes to be arranged to said displacement generator means and said control means;
   wherein said vector memory means is connected to said control means, said displacement generator means and said vector/raster converter means, said external source means is connected to said displacement generator means and said control means, said control means is connected to said displacement generator means, said window generator means, and said occupation analyzer means, said occupation analyzer means is connected to said vector/raster converter means, said vector/raster converter means is connected to said display means, said window generator means is connected to said displacement generator means.

7. An apparatus as claimed in claim 6, wherein said window generator means is further connected to said vector memory means.

8. An apparatus as claimed in claim 6, wherein said window generator means is further connected to said vector/raster converter means.

9. An apparatus as claimed in claim 6, further comprising interface means, connected to said control means, for enabling manual arrangement of said shapes to be arranged.

10. An apparatus as claimed in claim 5, wherein said vector memory means (1) comprises a memory (10), a double normal form transformer (11), a provisional memory (12), a comparator unit (13) and a stack memory (14), wherein said double normal form transformer (11) is connected to said comparator unit (13) and said memory (10), said comparator unit (13) is connected to said memory (10) and said stack memory (14), and said stack memory (14) is connected to said memory (10).

11. An apparatus according to claim 5, wherein said displacement generator means (4) comprises an inner controller (18), a shape memory (16), a multiplexer (23), a position transformer (19), an overlap analyzing means (17), a scalar value generator (20), an environment memory (15), a scalar value stack memory (22) and a stack memory controller (21), wherein said inner controller (18) is connected to said shape memory (16), said stack memory controller (21) and said multiplexer (23), said multiplexer (23) is connected to said stack memory controller (21) and said position transformer (19), said position transformer (10) is connected to said shape memory (16), said overlap analyzing means (17) and said scalar value stack memory (22), said overlap analyzing means (17) is connected to said scalar value generator (20) and said environment memory (15), said scalar value generator (20) is connected to said scalar value stack memory (22), and said scalar value stack memory (22) is connected to said stack memory controller (21).

12. An apparatus as claimed in claim 5, wherein said occupation analyzer means (5) comprises a separator unit (24), a discriminator unit (25), an unfilled area totalizer (31), a co-ordinate counter (26), a co-ordinate register (27), an unfilled dot counter (28), a gravity center generator (38), an area generator (39), a write-in logic (30), a parameter memory (29), a minimum limiter equivalence unit (33), a minimum limiter register (32), a magnitude logic (34), a length register (40), a length equivalence unit (41), an address register (37), an interval register (35), an interval equivalence unit (36), a magnitude register (42), a magnitude equivalence unit (43), and a magnitude stack memory (44), wherein said separator unit (24) is connected to said unfilled area totalizer (31), said co-ordinate register (26) and said discriminator unit (25), said discriminator unit (25) is connected to said unfilled area totalizer (31), said co-ordinate register (27), said unfilled dot counter (28), said magnitude logic (34), said length equivalent unit (41), said write-in logic (30), and said interval equivalence unit (36), said co-ordinate register (27) is connected to said write-in logic (30) and said interval equivalence unit (36), said unfilled dot counter (28) is connected to said gravity center generator (38), said area generator (39), said write-in logic (30), said length equivalence unit (41) and said minimum limiter equivalence unit (33), said minimum limiter equivalence unit (33) is connected to said magnitude logic (34) and said minimum limiter register (32), said magnitude logic (34) is connected to said write-in logic (30), said length equivalence unit (41) is connected to said write-in logic (30) and said length register (40), said length register (40) is connected to said parameter memory (29), said magnitude equivalence unit (43) is connected to said magnitude register (42), said magnitude stack memory (44), said parameter memory (29), and said interval register (35), said interval register (35) is connected to said parameter memory (29), said interval equivalence unit (36), said address register (37) and said write-in logic (30), said address register (37) is connected to said parameter memory (29), said parameter memory (29) is connected to said magnitude stack memory (44), said write-in logic (30) is connected to said parameter memory (29), and said co-ordinate counter (26) is connected to said co-ordinate register (27).

* * * * *